United States Patent [19]

Lo

[11] 4,064,621
[45] Dec. 27, 1977

[54] CADMIUM DIFFUSED $Pb_{1-x}Sn_xTE$ DIODE LASER

[75] Inventor: Wayne Lo, Troy, Mich.
[73] Assignee: General Motors Corporation, Detroit, Mich.
[21] Appl. No.: 723,803
[22] Filed: Sept. 16, 1976
[51] Int. Cl.[2] .................................................. H01L 7/00
[52] U.S. Cl. .................................................. 29/569 L
[58] Field of Search ................... 331/94.5 H; 29/583, 29/589, 590, 591, 569 L

[56] References Cited
PUBLICATIONS

Reduction of Carrier Concentration in $Pb_{1-x}Sn_xTe$ by Cd diffusion and Doping with Zn; Linden, J. Electrochem. Soc.; vol. 120, pp. 1131–1134 (Aug. 1973).

*Primary Examiner*—Gerald A. Dost

*Attorney, Agent, or Firm*—Robert J. Wallace

[57] ABSTRACT

A higher power infrared $Pb_{1-x}Sn_xTe$ diode laser that is tunable at this high output power at all wavelengths from 6.5 – 32 microns, particularly 6.5 – 9 microns. The diode laser has a P-type laser cavity with a degenerate carrier concentration. A low carrier concentration N-type region is adjacent the P-type region. The N-type region has unique characteristics inherent to a cadmium diffusion from an external source at a temperature of about 350° – 500° C. The cadmium diffusion N-type region forms a flat PN junction with the P-type laser cavity. Dislocation density in the monocrystal forming the completed laser body, even after the cadmium diffusion, is not noticeably higher than in the monocrystal from which the laser is made. A method of forming such a laser, using a short time, low temperature cadmium diffusion process, is claimed.

3 Claims, 2 Drawing Figures

CADMIUM DIFFUSED $Pb_{1-x}Sn_xTe$ DIODE LASER

BACKGROUND OF THE INVENTION

This invention relates to a semiconductor infrared laser, and more particularly to a higher power $Pb_{1-x}Sn_xTe$ diode infrared laser with substantially complete infrared frequency coverage. It also involves an improved method of making such a laser.

The band gap energy of a semiconductor material determines the photon energy of semiconductor diode radiation. Accordingly, the wavelength of the semiconductor diode radiation is a function of the semiconductor material band gap. A laser internally collects such radiation and amplifies it by using the collected radiation to stimulate additional radiation. Since the additional stimulated radiation is from the same semiconductor diode, it is of the same wavelength. Hence, the wavelength of radiation emitted from a semiconductor laser is essentially a function of the semiconductor material band gap.

A semiconductor laser is usually formed in a monocrystalline body having a PN junction and two mutually parallel reflective faces perpendicular to the PN junction. The body is usually a parallelepiped, and the reflective surfaces form a laser cavity adjacent one side of the PN junction. However, the cavity does not have to be formed in a parallelepiped body, or even in a body with flat parallel faces. Ring-type lasers, cylindrical lasers, and others are known.

The lasing action is produced by applying a voltage across the PN junction. Radiation emitted from the PN junction due to the voltage applied is collected and amplified in the laser cavity. The amplified radiation exits the laser cavity parallel to the PN junction as a monochromatic and coherent beam. The radiation wavelength emitted by a laser, as previously mentioned, is essentially a function of the semiconductor material band gap. Composition of the semiconductor material is the most important factor that determines the band gap. However, it is not the only factor. Laser body operating temperature, magnetic fields and pressure also affect the band gap. They can be used to precisely adjust the principal active radiation mode of a laser to a preselected wavelength. Such adjustment is referred to herein as tuning.

$Pb_{1-x}Sn_xTe$ semiconductors have band gap energies which make them ideally suited for lasers that emit infrared radiation of a wavelength from about 6.5 microns to 32 microns. In the past, $Pb_{1-x}Sn_xTe$ lasers could not be made with high output power for all infrared frequencies, as for example wavelengths of 6.5 – 9 microns. This particular range is of interest for spectroscopy applications.

Imperfections in the PN junction and contiguous regions of the semiconductor diode laser are highly undesirable. They produce both electrical and optical losses that reduce output powder of the preselected principal active radiation mode. In lead-tin telluride bodies, it is difficult to obtain a satisfactory PN junction that has contiguous regions with satisfactory carrier concentrations, mobilities and dislocation densities.

Various techniques have been used in the past to produce a PN junction in a lead-tin telluride body, including impurity diffusion from an external source. The impurity diffused PN junction was formed at a relatively high temperature; e.g., above 700° C. Cooling the monocrystalline body from such a high temperature treatment such as this can generate crystal dislocations. Crystal dislocations can cause inferior PN junctions and reduce current carrier mobility, resulting in lower output power in the laser. Self-diffusion procedures have also been used to form the PN junction. They may have involved somewhat lower treatment temperatures. However, the lasers thus formed were limited in output power for some radiation wavelengths, as for example 0.1 milliwatt at 6.5 – 9 micron wavelengths.

I have now found that cadmium rapidly diffuses into $Pb_{1-x}Sn_xTe$ at a relatively low temperature. It produces low carrier concentration, high mobility N-type regions that, if thin, form excellent PN junctions for a semiconductor laser. The cadmium is diffused into the crystal from an external source. Hence, full variation in semiconductor composition is available, which permits one to tune the laser to the full spectrum of infrared wavelengths from 6.5 microns to 32 microns while maintaining higher output power. In addition, the low temperature cadmium diffusion minimizes any increase in crystal dislocations in cooling after diffusion, and any power losses directly or indirectly attributable to them. Accordingly, a more tunable, higher output power infrared laser can be obtained. By higher output, I mean output of the order of 1 milliwatt. Other advantages are also obtained, since only a short duration heat treatment is needed to obtain sufficient cadmium diffusion.

OBJECTS AND SUMMARY OF THE INVENTION

Principal objects of this invention are, therefore, to provide a higher output, more tunable $Pb_{1-x}Sn_xTe$ semiconductor infrared laser, and to provide a method of making such a laser.

The objects of this invention are obtained with a single crystal body of $Pb_{1-x}Sn_xTe$ in which $x$ is about 0 – 30 mol percent. The $Pb_{1-x}Sn_xTe$ semiconductor is of P-type conductivity and has a degenerate carrier concentration. A low carrier concentration, high electron mobility N-type region, formed by a short duration, low temperature cadmium diffusion, makes a flat and effectively abrupt high injection efficiency PN junction that separates two opposite faces of the body. The thickness of the cadmium diffusion layer and dimensions of the body are predetermined to obtain enhanced efficiency and output power tuned to a preselected wavelength of infrared radiation. The cadmium diffusion does not significantly increase the dislocation density of the semiconductor crystal starting material. It produces a low carrier concentration through the thickness of the diffusion region and a substantially planar diffusion front of cadmium.

BRIEF DESCRIPTION OF THE DRAWING

The invention will be more fully understood from the following description of its preferred embodiments and from the drawing, in which.

DESCRIPTION OF THE PREFERRED EMBODIMENTS

Figure 1:
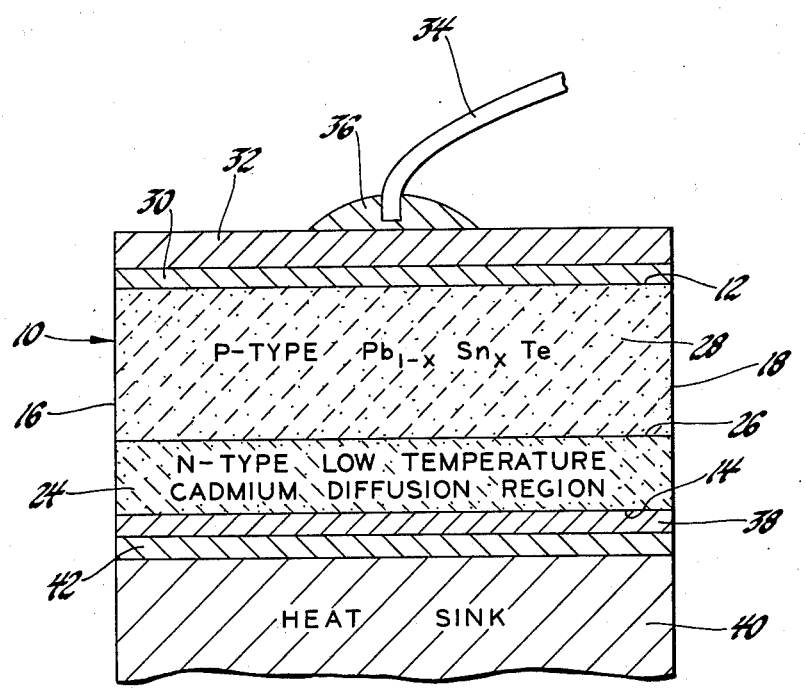
FIG. 1 shows a sectional view along the line 1—1 of FIG. 2.
Figure 2:
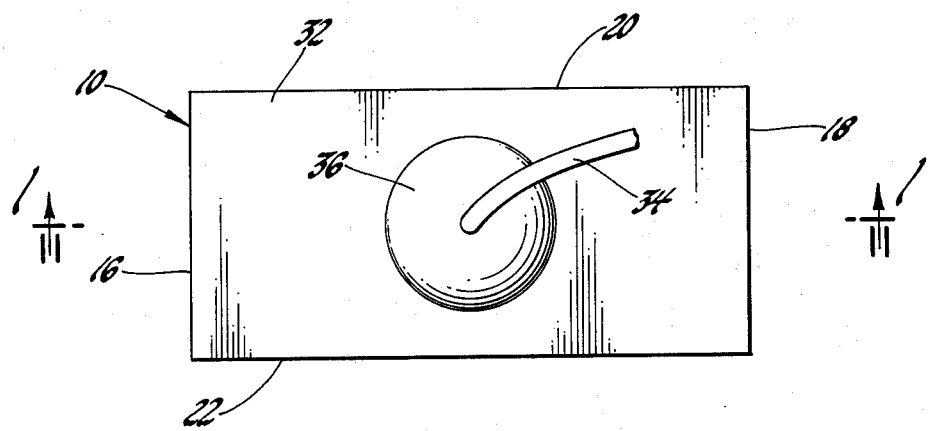
FIG. 2 shows a plan view of a laser body formed in accordance with this invention.

The drawing shows a laser body 10 made in accordance with the invention. Body 10 is a tellurium-rich single crystal of $Pb_{1-x}Sn_xTe$ P-type semiconductor material, wherein $x$ is 13 mol percent. It has a carrier concentration of about $9 \times 10^{18}$ holes per cubic centimeter.

Body 10 is a parallelepiped having top and bottom major surfaces 12 and 14, end surfaces 16 and 18, and side surfaces 20 and 22 that are substantially perpendicular to one another. Body 10 is about 200 micrometers thick between major surfaces 12 and 14. It is about 250 – 500 micrometers long from end surface 16 to end surface 18, and about 200 micrometers wide between side surfaces 20 and 22. All of these surfaces are parallel to the (100) facets of the lead-tin telluride monocrystal forming the body. End faces 16 and 18 are polished in the customary manner to enhance laser emission from end faces 16 and 18.

A 75 micrometer thick N-type region 24 extends across the entire bottom surface 14 of body 10. N-type region 24 forms a PN junction 26 with the upper portion 28 of the P-type $Pb_{1-x}Sn_xTe$ crystal. PN junction 26 is parallel to surfaces 12 and 14 so that it intersects end surfaces 16 and 18 and side surfaces 20 and 22. It thus provides a rectifying barrier separating top and bottom surfaces 12 and 14. About 30 microns of the thickness of upper portion 28 immediately above the PN junction 26 forms the laser cavity in body 10.

N-type region 24 is doped with cadmium atoms that have been diffused through surface 14 at a temperature of 450° C. for 1 hour. The dislocation density in region 24, as well as the laser cavity 28, is about $1 \times 10^4$ dislocations per square centimeter. The free electron concentration in region 24 is about $1 \times 10^{17}$ per cubic centimeter.

The low carrier concentration and low dislocation density in region 24 produce a high electron mobility of $5 \times 10^5$ square centimeters per volt — second, which is particularly desirable for the low temperatures at which the laser body 10 is operated. The low dislocation density of the starting crystal used, about $1 \times 10^4$ dislocations per square centimeter, and the unique cadmium diffusion process used, jointly enhance planarity of the diffusion front, thus minimizing the effect of minor diffusion irregularities such as pipe diffusions. The more planar diffusion front and the high electron mobility of region 24 provide a PN junction 26 with higher injection efficiency and lower leakage.

The planarity of PN junction 26 and its perpendicular relationship to end surfaces 16 and 18 reduces light scatter in the laser cavity in region 28. Accordingly, optical losses are reduced within the laser cavity. In this embodiment of the invention, the laser body 10 can be readily tuned to a wavelength of about 10.6 microns.

A 0.1 micrometer thick platinum coating 30 on the top surface 12 serves as a low electrical resistance, ohmic, contact to this surface. A 2 micrometer thick coating 32 of indium is on the platinum coating 30. A silver terminal wire 34 is soldered to the coating 32 by means of a drop 36 of indium. Bottom surface 14 of laser body 10 has an indium coating 38, about 2 micrometers thick, serving as a low electrical resistance, ohmic, contact to this surface. Laser body 10 is soldered to a gold plated copper heat sink 40 by means of an interjacent layer 42 of indium about 500 micrometers thick. The heat sink is, in turn, secured within a housing of a closed cycle refrigerator or a cryogenic dewar (not shown) in the usual manner for operation at cryogenic temperatures, as for example about 10° K. The specific temperature of laser body 10 during operation can, of course, be varied from this temperature as desired.

The semiconductor material forming laser body 10 is of monocrystalline semiconductor material to obtain highest efficiency and power output. For ease of fabrication and highest power I prefer that it be a parallelepiped of dimensions described herein. However, the invention can be used in laser bodies of other shapes, such as mesas, rings, cylinders, etc. Analogously, the stoichiometry of the $Pb_{1-x}Sn_xTe$ composition can be varied in my invention as in any other lead-tin telluride infrared laser. The composition is varied to obtain the band gap energy commensurate with the range of infrared energy within which the laser is to be tuned. It is known that $x$ may vary from zero to as high as about 30 mol percent. Within this latter range, lower proportions produce a wider band gap for shorter wavelength radiation, and higher proportions, vice versa. It is particularly of interest to use compositions in which $x$ is 0 – 8 mol percent. These latter compositions have band gaps producing 6.5 – 9 micron wavelength radiation. When $x$ is 0, the composition is actually lead telluride.

If the $Pb_{1-x}Sn_xTe$ composition has a molar excess of tellurium it is considered tellurium-rich. If it has a molar excess of lead and/or tin, it is considered to be metal-rich. It is known how to induce P-type conductivity in $Pb_{1-x}Sn_xTe$ compositions by use of either a tellurium-rich or metal-rich material and a selected annealing temperature that produces a self-diffusion. Annealing can be done during crystal growth or by heat treatment after crystal growth. Self-diffusion can be used to produce a preselected carrier concentration of holes. A technique for producing tellurium-enriched P-type crystals of low dislocation density is disclosed by Lo et al in "Ingot-Nucleated $Pb_{1-x}Sn_xTe$ Diode Lasers", *Journal of Applied Physics*, v 47, n 1, pp. 267-271 (January 1976). The dislocation density reported is $1 \times 10^4$ dislocations per square centimeter. This same technique has been used to produce crystals with a dislocation density as low as $1 \times 10^3$ dislocations per square centimeter. P-type $Pb_{1-x}Sn_xTe$ crystals obtained by other techniques can also be used with the cadmium diffusion method of this invention to produce a laser body. However, in view of the foregoing, it is obviously desirable to use a technique that will produce low dislocation density crystals.

As already mentioned, high carrier mobility and low dislocation density in region 24 is desired to obtain highest output of the semiconductor laser. In the past, one may start out to make a laser with a crystal having a low dislocation density. However, in making the laser the processing techniques used introduced a significant number of additional dislocations. For example, the crystal of the finished laser at least contained 10 times the dislocation density one started with, and ofter two or three orders of magnitude more. Semiconductor diode lasers were made in the past by use of higher temperature treatments. Cooling the crystal from these high temperatures generates the dislocations. The higher the temperature, the more the stress during cooling and the more the dislocations that result.

Dislocations can also cause PN junction 26 to be nonplanar. Hence, I prefer to start with a crystal having a crystal dislocation density at least below $1 \times 10^6$ per square centimeter. For higher output power, it should be below about $1 \times 10^4$ per square centimeter. Best results are obtainable with the crystal dislocation density of below about $1 \times 10^3$ per square centimeter or less. In my finished laser body 10, the crystal dislocations are not noticeably greater than in the crystal from which it is made.

The thickness of parallelepiped body 10 should be less than 250 micrometers to obtain a lower series resistance between crystal faces 12 and 14 and better crystal cooling. In most instances I prefer to have a crystal which is approximately 250 micrometers thick. While I have described laser body 10 as being about 250 – 500 micrometers long, other lengths can be used, as is known in connection with other $Pb_{1-x}Sn_xTe$ infrared lasers. Laser body 10 is approximately 100 – 200 micrometers wide. Narrower widths could be used, and may even be better, but as a practical matter are difficult to satisfactorily produce. Bodies wider than 200 micrometers may contain regions of nonhomogeneous composition that may generate undesired active radiation modes. Multimode operation is generally not desired.

If cadmium diffusion layer 24 is significantly less than about 10 micrometers deep, precise control of the diffusion is more difficult. Moreover, with diffusion depths of only about 2 – 5 micrometers, surface effects may have an adverse effect. On the other hand cadmium layer thicknesses greater than about 100 micrometers tend to produce PN junctions which are too far away from the heat sink and not as satisfactory in operation.

Ohmic contacts 30 and 38 do not have to be of platinum and indium, respectively. While important, they are no more important to my laser body than to any other $Pb_{1-x}Sn_xTe$ laser body. Accordingly, any contact material and process for applying it can be used, so long as it provides a low resistance electrical connection to the crystal. For example, gold can be used in place of platinum for contact 30. Gold, or lead, can also be used for contact 38. Virtually any ductile metal can be used for indium layer 32. Also, gold or platinum can be used for terminal wire 34, and attached to indium layer 32 by any conductive substance that will withstand the low operating temperatures. Further, as with other such lasers, electrical connection to contacts 32 and 38 need not even be a soldered wire. It can be a pressure contact.

In making laser body 10, a single crystal of $Pb_{1-x}Sn_xTe$ such as previously described is first cut into slices about 1 millimeter thick, and then polished to a lesser thickness using known and accepted techniques. Slices can be cut from the crystal using a wire saw with the cutting direction being carefully aligned to one of the (100) facets of the crystal. A fairly smooth cut is obtained by using a 43 micrometer diameter wire, and by reducing the cutting speed to 100 centimeters per second. Cutting damage is removed by polishing the sample on a pitch pad immersed in concentrated hydrobromic acid containing 5% $Br_2$. This polishing is followed by a final polishing in running water on a silk pad. The resultant surface 14 of body 10 will have a deviation from flatness of the order of 0.2 micrometers, as measured by an interference microscope. The polished slice will have a thickness of about 400 – 600 micrometers, preferably 500 micrometers.

The slice is then spray etched with concentrated hydrobromic acid containing 2% $Br_2$ immediately before being sealed off in an ampoule for cadmium diffusion. The sample is placed in a quartz ampoule of 7.5 cubic centimeters volume, and 0.5 milligrams of cadmium is also placed in the ampoule. It is important to produce a predetermined vapor pressure of cadmium in the ampoule. Too high a vapor pressure will produce undesirable results, such as an undesirably high carrier concentration in the diffusion area and perhaps even produce surface deposits. Too low a vapor pressure will not produce adequate doping and may not even produce conductivity inversion. The vapor pressure in the sealed ampoule at diffusion temperature is not known. However, the quantity of cadmium needed to produce it has been experimentally determined. In the 7.5 cubic centimeter ampoule, about 0.4 – 0.6 milligrams of cadmium can be satisfactorily used, with 0.5 milligrams producing the best results. Thus, about 0.05 – 0.08 milligrams of cadmium per cubic centimeter of ampoule volume should be used.

The ampoule is placed in a vacuum chamber and sealed off at at least about $1 \times 10^{-6}$ Torr. The ampoule is then placed in a room temperature furnace and heated to a temperature of approximately 450° C., and held there for 1 hour. The rate of heating from about 100° C. to 450° C. should generally be about 100° C. per hour to reduce dislocation generation due to strain. After 1 hour at 450° C. the furnace is allowed to cool at a rate of approximately 100° C. per hour until a substrate temperature of approximately 150° C. is reached. The ampoule can then be removed from the furnace, allowed to cool in room air, and opened. Junction depth should be about 75 micrometers, as measured by a thermoelectric probe method.

Cleaning and other preparations of the crystal slice prior to my cadmium diffusion are no more critical than prior to any other diffusion for producing a PN junction. Cleanliness and surface flatness are important but any of the known and accepted procedures can be used.

It is important that the cadmium diffusion process be carried out at a relatively low temperature and for a short time duration in order to obtain highest output power. Highly satisfactory results have been obtained with a cadmium diffusion at 450° C. for 1 hour. Diffusion temperatures of 400° – 500° C. are preferred. Cooling from diffusion temperatures higher than about 500° C. can contribute significantly to generation of crystal dislocations. On the other hand, at cadmium diffusion temperatures less than about 350° C., cadmium diffusion rates become undesirably slow. Temperatures less than about 300° C. do not permit adequate cadmium diffusion, due to a significant drop in cadmium vapor pressure.

Both the heating to and cooling from diffusion temperatures should be at moderate rates of about 100° – 200° C. per hour to reduce strain in the crystal but fast enough to avoid annealing it. Annealing is more likely to occur at rates less than about 50° C. per hour. Strains are more likely to occur at rates greater than about 500° C. per hour. Preferred diffusion time is about 1 hour. However, it should be recognized that it can be varied somewhat depending on the junction depth desired, the diffusion temperature used, and the heating and cooling rates employed. However, a diffusion time of the order of 1 hour, rather than 10 hours, should normally be used. Diffusion times as low as 20 minutes have been used for shallower junctions but diffusion times longer than 2 hours should be avoided.

The cadmium diffusion process is carried out under conditions designed to eliminate impurities other than cadmium. After placing the sample and cadmium in the ampoule, it is sealed while under a vacuum of at least $1 \times 10^{-6}$ Torr, and preferably $1 \times 10^{-7}$ Torr. Higher vacuums can be used but do not appear to be necessary. After diffusion, ohmic contacts are applied to the opposite major surfaces 12 and 14 of the slice. They can be produced in the normal and accepted manner. As in other $Pb_{1-x}Sn_xTe$ lasers, it is important that the ohmic contacts be applied in a manner that produces lowest contact resistance to obtain highest output power. For example, after the cadmium diffusion, surface 12 is polished in concentrated hydrobromic acid containing 5% $Br_2$ to reduce slice thickness to approximately 200 – 250 micrometers. It is then rinsed in deionized water and polished with 5 micrometer grit aluminum oxide to increase surface roughness. This is done to obtain better adhesion between surface 12 and platinum layer 30. It is believed that this increased adhesion produces a lower and more stable contact resistance. Analogously, surface 14 is also polished with the aluminum oxide grit to enhance adhesion of indium layer 38, and obtain the attendant lower and more stable contact resistance.

The platinum layer 30 is then electroplated onto surface 12. Immediately following the platinum deposition, a 2 micrometer thick layer 32 of indium is electroplated onto the platinum layer 30. The same electroplating processes used in making other lead-tin telluride lasers can be used.

The slice is then placed in a vacuum evaporation chamber, and the chamber evacuated to a pressure of approximately $2 \times 10^{-7}$ Torr. The indium coating 38 is then evaporated onto surface 14 of the crystal to a thickness of 0.2 micrometer. The vacuum is then removed, the chamber opened and an additional 1.8 micrometers of indium electroplated over the vapor deposited indium.

The side faces 20 and 22 and end faces 16 and 18 of the crystal body are then produced by cleaving the crystal along the (100) crystal faces, resulting in the elongated parallelepiped body 10. The crystal is cleaved to yield a parallelepiped body about 100 – 200 micrometers wide and about 300 – 600 micrometers long. The end faces 16 and 18 are then polished to a reflective surface finish in the normal and accepted manner for laser bodies, which reduces body length to about 250 – 500 micrometers. They can be polished by initially lapping them flat with a 1 micrometer grit aluminum oxide abrasive, and then rinsing them in deionized water. As usual, care is taken to maintain these end surfaces mutually parallel and perpendicular to the other body surfaces. They are then final polished in concentrated hydrobromic acid containing 5% $Br_2$, and rinsed again.

Silver wire 34 is then soldered by a dab of indium 36 to indium coating 32, being careful not to produce direct contact between wire 34 and surface 12 during the soldering operation.

Body 10 is then soldered to a gold plated copper heat sink 40 by flowing indium over the heat sink to form a thin layer 42 on the heat sink. Semiconductor body 10 is then placed on the indium layer 42 on heat sink 40. The assembly is raised to a temperature of approximately 180° C. for approximately 3 seconds to securely and intimately bond body 10 to heat sink 40. Laser body 10 is then ready for mounting in a closed cycle refrigerator or dewar for use as a laser. It should also be mentioned that the body 10 need not be soldered to heat sink 40. It can be clamped against the heat sink indium layer 42 to hold it in place.

I claim:

1. A method of making a higher power, more tunable lead-tin telluride infrared laser, said method comprising:
    placing a body of low dislocation density monocrystalline P-type semiconductive material in a chamber to receive cadmium as a diffusant, said semiconductive material having the composition $Pb_{1-x}Sn_xTe$ with $x$ being a value from zero to about 30 mol percent that is selected to provide a band gap corresponding to a photon of infrared radiation of a predetermined wavelength within a range of 6.5 – 32 microns;
    placing in said chamber a quantity of cadmium that is equal to about 0.05 – 0.08 milligrams of cadmium per cubic centimeter of chamber volume;
    closing said chamber while it is evacuated to a pressure no greater than about $1 \times 10^{-6}$ Torr;
    heating said chamber at a preselected rate of about 50° – 500° C. per hour to a diffusion temperature of about 350° – 500° C.;
    maintaining said diffusion temperature for a preselected duration up to about 2 hours to diffuse cadmium into a surface of said body and form a planar, high injection efficiency PN junction in said body that is parallel to and at a preselected depth below said surface;
    cooling said body in said chamber from said diffusion temperature at a preselected rate of about 50° – 500° C. per hour to a temperature of about 150° C.;
    cooling said body to room temperature at any rate, and removing it from said chamber at any time, after said body has been cooled to about 150° C. in said chamber;
    contouring and polishing said body into a predetermined form that has a laser cavity adjacent said PN junction for collecting and amplifying infrared radiation of said predetermined wavelength;
    applying ohmic contacts to said body by which a voltage can be applied across said PN junction to generate said infrared radiation of predetermined wavelength for collection and amplification in said laser cavity; and
    placing said contoured and polished body in intimate thermal association with cooling means for removing heat produced during generation, collection and amplification of said infrared radiation.

2. A method of making a higher power, more tunable lead-tin telluride infrared laser, said method comprising:
    placing a body of low dislocation density monocrystalline P-type semiconductive material in a chamber to receive cadmium as an N-type conductivity determining diffusion, said monocrystalline body having a (100) crystal plane and a surface parallel thereto, said semiconductive material having the composition $Pb_{1-x}Sn_xTe$ with $x$ being a value from zero to about 30 mol percent that is selected to provide a band gap corresponding to a photon of infrared radiation of a predetermined wavelength within a range of 6.5 – 32 microns;
    placing in said chamber a quantity of cadmium that is equal to about 0.05 – 0.08 milligrams of cadmium per cubic centimeter of chamber volume;
    closing said chamber while it is evacuated to a pressure no greater than about $1 \times 10^{-6}$ Torr;
    heating said closed chamber at a preselected rate of about 100° – 200° C. per hour to a diffusion temperature of about 400° – 500° C.;
    maintaining said diffusion temperature for a preselected duration of the order of about 1 hour to diffuse cadmium into said body surface and form a planar, high injection efficiency PN junction in said body that is parallel to and at a preselected depth below said surface;

cooling said body in said closed chamber from said diffusion temperature at a preselected rate of about 100° – 200° C. per hour to a temperature of about 150° C.;

cooling said body to room temperature at any rate, and removing it from said closed chamber at any time, after said body has been cooled to about 150° C. in said chamber;

contouring and polishing said body into a parallelepiped that has a laser cavity adjacent said PN junction for collecting and amplifying infrared radiation of said predetermined wavelength;

applying ohmic contacts to said body by which a voltage can be applied across said PN junction to generate said infrared radiation of predetermined wavelength for collection and amplification in said laser cavity; and placing said parallelepiped in intimate thermal communication with cooling means for removing heat produced during generation, collection and amplification of said infrared radiation.

3. A method of making a higher power, more tunable lead-tin telluride infrared laser, said method comprising:

polishing opposite surfaces of an elongated low dislocation density monocrystalline P-type semiconductive material parallel to its (100) crystal plane to form flat and parallel opposite surfaces on said body spaced about 400 – 600 micrometers apart, said semiconductive material having the composition $Pb_{1-x}Sn_xTe$ with $x$ being a value from zero to about 8 mol percent that is selected to provide a band gap corresponding to a photon of infrared radiation of a predetermined wavelength within a range of 6.5 – 9 microns and having a tellurium content up to 0.01 mol percent in excess of 50 mol percent to induce said P-type conductivity;

placing said body in a chamber for receiving cadmium as and N-type conductivity determining diffusant;

placing in said chamber a quantity of cadmium that is equal to about 0.06 – 0.07 milligrams of cadmium per cubic centimeter of chamber volume;

sealing said chamber while it is evacuated to a pressure no greater than about $1 \times 10^{-6}$ Torr;

heating said sealed chamber at a preselected rate of the order of about 100° C. per hour to a diffusion temperature of about 400° – 500° C.;

maintaining said diffusion temperature for a preselected duration up to about ½ – 1½ hours to diffuse cadmium into both of said opposite surfaces of said body and form a planar, high injection efficiency PN junction in said body that is parallel to said surfaces and at a preselected depth, within a range of 20 – 100 micrometers, below said surfaces;

cooling said body in said sealed chamber from said diffusion temperature at a preselected rate of the order of 100° C. per hour to a temperature of about 150° C.;

cooling said body to room temperature at any rate, and removing it from said chamber at any time, after said body has been cooled to about 150° C. in said chamber;

polishing one of said opposite surfaces of said body to remove its cadmium diffusion layer and reduce body thickness to less than about 250 micrometers;

cleaving said body along said (100) crystal planes perpendicular to said opposite surfaces to form an elongated parallelepiped less than about 200 micrometers wide and about 300 – 600 micrometers long;

polishing end surfaces of said elongated parallelepiped body to a reflective surface finish to form a laser cavity about 250 – 500 micrometers long adjacent said PN junction for collecting and amplifying said infrared radiation of predetermined wavelength;

forming a discrete ohmic contact to each of said opposite surfaces of said body by which a voltage can be applied across said PN junction to generate said infrared radiation of predetermined wavelength for collection and amplification in said laser cavity; and soldering the parallelepiped body surface containing the remaining cadmium diffusion layer to a cooling member for removing heat produced in said body adjacent said PN junction during generation, collection and amplification of said infrared radiation.

* * * * *